United States Patent
Okuyama (10) Patent No.: US 7,979,153 B2
(45) Date of Patent: Jul. 12, 2011

(54) EXPOSURE DATA GENERATING APPARATUS

(75) Inventor: Takashi Okuyama, Saitama (JP)

(73) Assignee: ORC Manufacturing Co., Ltd., Tokyo (JP)

( * ) Notice: Subject to any disclaimer, the term of this patent is extended or adjusted under 35 U.S.C. 154(b) by 897 days.

(21) Appl. No.: 11/944,762

(22) Filed: Nov. 26, 2007

(65) Prior Publication Data

US 2008/0154923 A1    Jun. 26, 2008

(30) Foreign Application Priority Data

Dec. 22, 2006 (JP) ................. 2006-345480

(51) Int. Cl.
G06F 19/00    (2006.01)
(52) U.S. Cl. ................... 700/121; 250/492.22
(58) Field of Classification Search ........... 700/121; 250/492.22
See application file for complete search history.

(56) References Cited

U.S. PATENT DOCUMENTS

| | | | |
|---|---|---|---|
| 5,980,088 A * | 11/1999 | Iwasaki et al. | 700/166 |
| 6,100,915 A * | 8/2000 | Iwasaki et al. | 347/249 |
| 6,886,154 B2 | 4/2005 | Okuyama | |
| 7,039,487 B2 * | 5/2006 | Nagata et al. | 700/121 |
| 7,136,087 B2 | 11/2006 | Okuyama et al. | |
| 7,266,802 B2 * | 9/2007 | Sekigawa | 430/30 |
| 7,295,885 B2 | 11/2007 | Okuyama | |
| 2003/0001798 A1 | 1/2003 | Okuyama | |
| 2010/0161093 A1 * | 6/2010 | Wong et al. | 700/97 |

FOREIGN PATENT DOCUMENTS

JP    2003 50469    2/2003

* cited by examiner

Primary Examiner — Ryan A Jarrett
(74) Attorney, Agent, or Firm — Greenblum & Bernstein, P.L.C.

(57) ABSTRACT

An exposure-data generating apparatus comprises a first memory, a second memory, and an exposure data memory. The first memory stores drawing data in bitmap format as first data that is used for an exposure. The second memory stores second data whose data unit in a column direction is converted to a resolution unit of information of each cell based on the first data. The exposure data memory stores exposure data that is raster data obtained by a burst transfer of third data at every column unit. The second data is rearranged and converted to the third data, where an arrangement of data of each cell of the second data in the column direction is changed to a row direction. The cell constitutes a display element of a Digital Micro-mirror Device that performs the exposure based on said exposure data.

4 Claims, 7 Drawing Sheets

EXPOSURE DATA GENERATING APPARATUS

BACKGROUND OF THE INVENTION

1. Field of the Invention

The present invention relates to an exposure-data generating apparatus, and in particular to an apparatus that generates exposure data for driving a two-dimensional display device such as a DMD (Digital Micro-mirror Device).

2. Description of the Related Art

A multiple exposure apparatus that uses the two-dimensional display device such as the DMD is proposed.

In the multiple exposure apparatus that uses the two-dimensional display device such as the DMD, the exposure data that is used for driving the two-dimensional display device is generated on the basis of drawing data such as bitmap data and a cell coordinate corresponding to a cell number of a cell constituting an element of the two-dimensional display device, as shown in Japanese unexamined patent publication (KOKAI) No. 2003-50469.

However, when the exposure data is generated, the cell coordinate is read from the cell coordinate table that stores the cell coordinate at every cell unit. In this case, the number of accesses to the cell coordinate table for generating the exposure data equals the number of cells. Therefore, one of the causes hindering the speed-up of exposure data generation is that there are numerous accesses to the cell coordinate table.

SUMMARY OF THE INVENTION

Therefore, an object of the present invention is to provide an exposure-data generating apparatus that can generate the exposure data at high speed.

According to the present invention, an exposure-data generating apparatus comprises a first memory, a second memory, and an exposure data memory. The first memory stores drawing data in bitmap format as first data that is used for an exposure. The second memory stores second data whose data unit in a column direction is converted to a resolution unit of information of each cell based on the first data. The exposure data memory stores exposure data that is raster data obtained by a burst transfer of third data at every column unit. The second data is rearranged and converted to the third data, where an arrangement of data of each cell of the second data in the column direction is changed to a row direction. The cell constitutes a display element of a Digital Micro-mirror Device (DMD) that performs the exposure based on said exposure data.

BRIEF DESCRIPTION OF THE DRAWINGS

The objects and advantages of the present invention will be better understood from the following description, with reference to the accompanying drawings, in which.

DESCRIPTION OF THE PREFERRED EMBODIMENTS

The present invention is described below with reference to the embodiment shown in the drawings. In this embodiment, a multiple exposure apparatus 1 comprises a controller 10 and a head unit 30 (see FIGS. 1 and 2).

Figure 2:
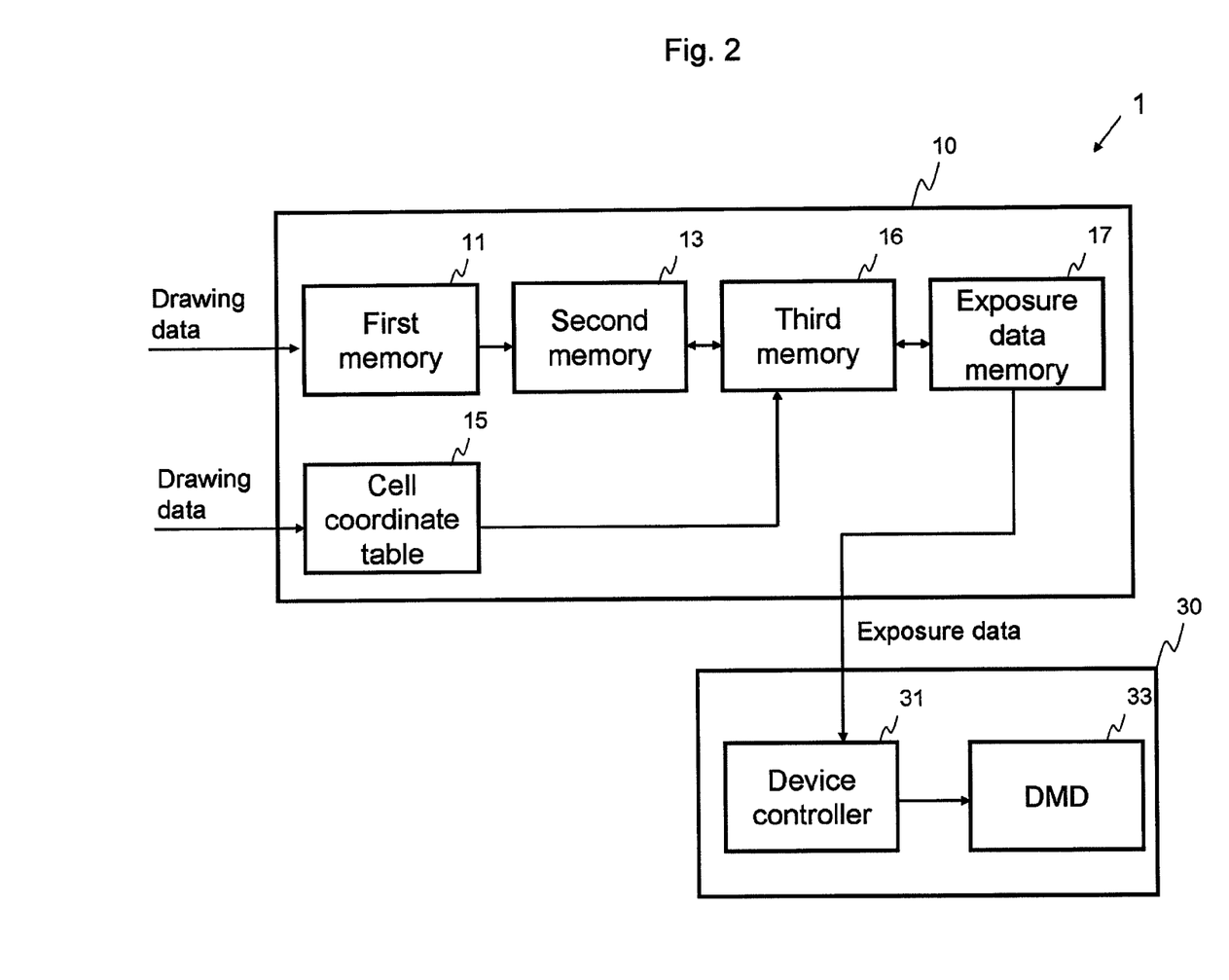
FIG. 2 is a block diagram of the multiple exposure apparatus.

The controller 10 performs a drawing processing operation that generates exposure data (raster data) on the basis of drawing data (e.g., vector data or CAD data).

The head unit 30 has a device controller 31 and a DMD 33 that performs an exposure on the basis of the exposure data. The device controller 31 drives the DMD 33 on the basis of the exposure data.

The controller 10 has five memories (a first memory 11, a second memory 13, a cell coordinate table 15, a third memory 16, and an exposure data memory 17).

The controller 10 converts the drawing data to the exposure data for driving the DMD 33 and stores the exposure data in the exposure data memory 17, in a procedure consisting of the first, second, third, fourth, and fifth steps, as described below.

The drawing data, which is the CAD data, is converted to the bitmap data and is stored in the first memory 11, as the first data. In other words, the first memory 11 stores the drawing data as the first data, in the bitmap format.

The data unit in the column direction of the bitmap data (the first data) is converted to the 1/n unit of a cell and is stored in the second memory 13, as the second data. In other words, the second memory 13 stores the second data whose data unit in the column direction is converted to the 1/n unit of a cell (i.e., the resolution unit of the information of each cell), based on the first data whose data unit in the column and row directions is a length unit.

The cell coordinate table 15, in the disclosed in the embodiment, is, for example, an SRAM (Static Random Access Memory) that stores a conversion table of the cell coordinate corresponding to the cell number of the cell. The cell coordinate is the row address of the top bit corresponding to the top cell of the column that becomes the object of the burst transfer, in other words, the column where the burst transfer is performed.

The second data, whose data unit in the column direction is converted to the 1/n unit of a cell, is rearranged and is stored in the third memory 16 that in the disclosed embodiment, is, for example, a DRAM (Dynamic Random Access Memory), as the third data (the conversion data). The arrangement of data of each cell of the second data in the column direction is thus changed (transposed) to the row direction, at one cell unit.

The exposure data memory 17 stores the exposure data that is in bitmap format and is obtained by the burst transfer of the third data at every column unit.

In the first step, the drawing data corresponding to the drawing area that is displayed by the DMD 33 is converted to the bitmap data (the first data) and is stored in the first memory 11. The data unit of the first data is a length unit, of for example, a unit of 1 μm.

Figure 3:
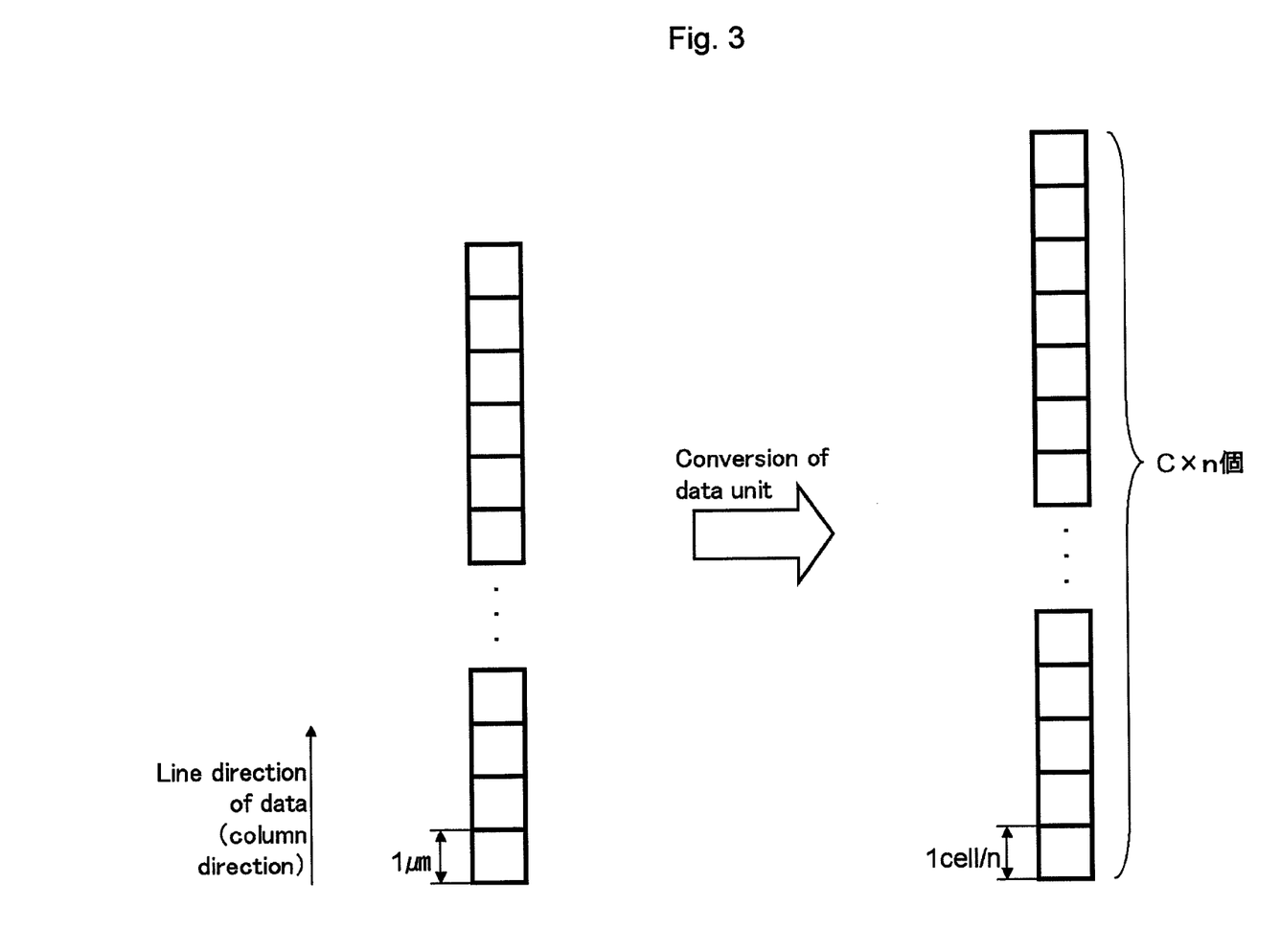
FIG. 3 shows a conversion of a data unit where the data unit in a column direction of bitmap data is converted from a length unit to a 1/n unit of a cell.
Figure 5:
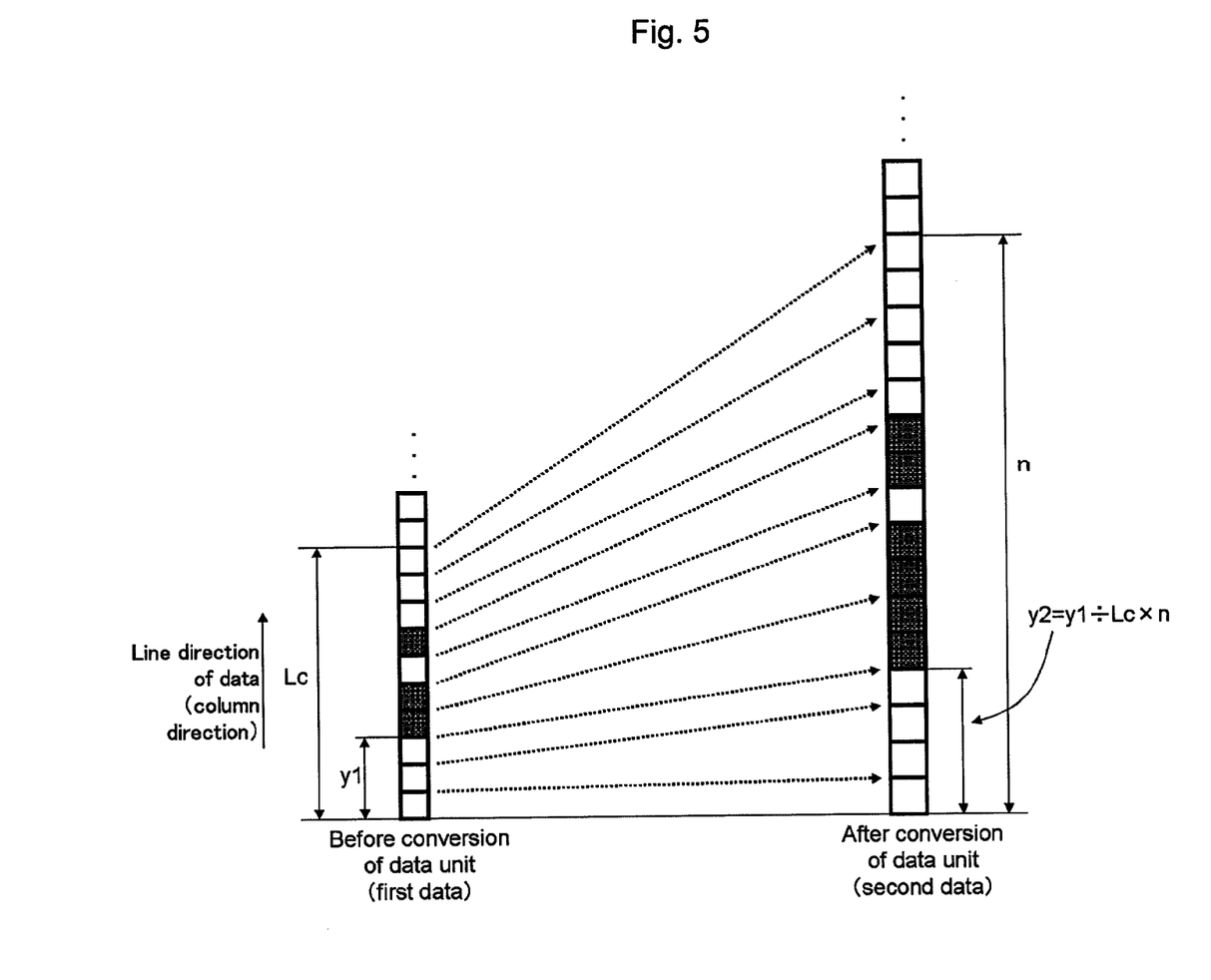
FIG. 5 shows a detail of the conversion from first data to the second data.

In the second step, the data unit of the bitmap data (the first data) which is stored in the first memory 11, is converted from the length unit to the 1/n unit of a cell constituting a display element of the DMD 33, and is stored in the second memory 13 as the second data (see FIGS. 3 and 5). The 1/n unit of a cell is the resolution unit of the information of each cell.

The resolution n, which is the number of partitions of the cell, is an integer that is greater than the size of cell Lc and an integral multiple of the column size of the second memory 13 that is usually a byte unit.

The resolution n is set to be greater than the size of cell Lc to prevent the loss of color information.

The resolution n is set to be an integral multiple of the column size of the second memory 13 so as to arrange the information of the cell pitch in the column direction after rearrangement.

FIG. 5 shows an example in which the size of the cell Lc is 10 and the resolution n, which is the number of partitions of the cell, is 16.

Specifically, the data is arranged in the column direction where the amount (number) of data is a product of the number of cells in column direction C multiplied by the resolution n (the number of partitions of the cell), so that the second data corresponding to the first data is generated. The number of cells in the column direction C is preferably set to 1024 or slightly more than 1024.

For example, in the case where the data unit of the first data is a unit of 1 μm, the size of the cell is 10 μm, and the resolution n (the number of partitions of the cell) is 16, the first data where 10 data are arranged in the column direction is converted to (i.e., expanded to) the second data where 16 data are arranged in the column direction.

In the second step, the conversion processing for all of the bitmap data (the first data) in the column direction where the data unit is converted from the length unit to 1/n unit of a cell, is performed.

However, the conversion processing for the bitmap data (the first data) in the row direction where the data unit is converted from the length unit to 1/n unit of a cell is not performed. In other words, the data unit of the bitmap data (the first data) in the row direction is not changed.

Figure 6:
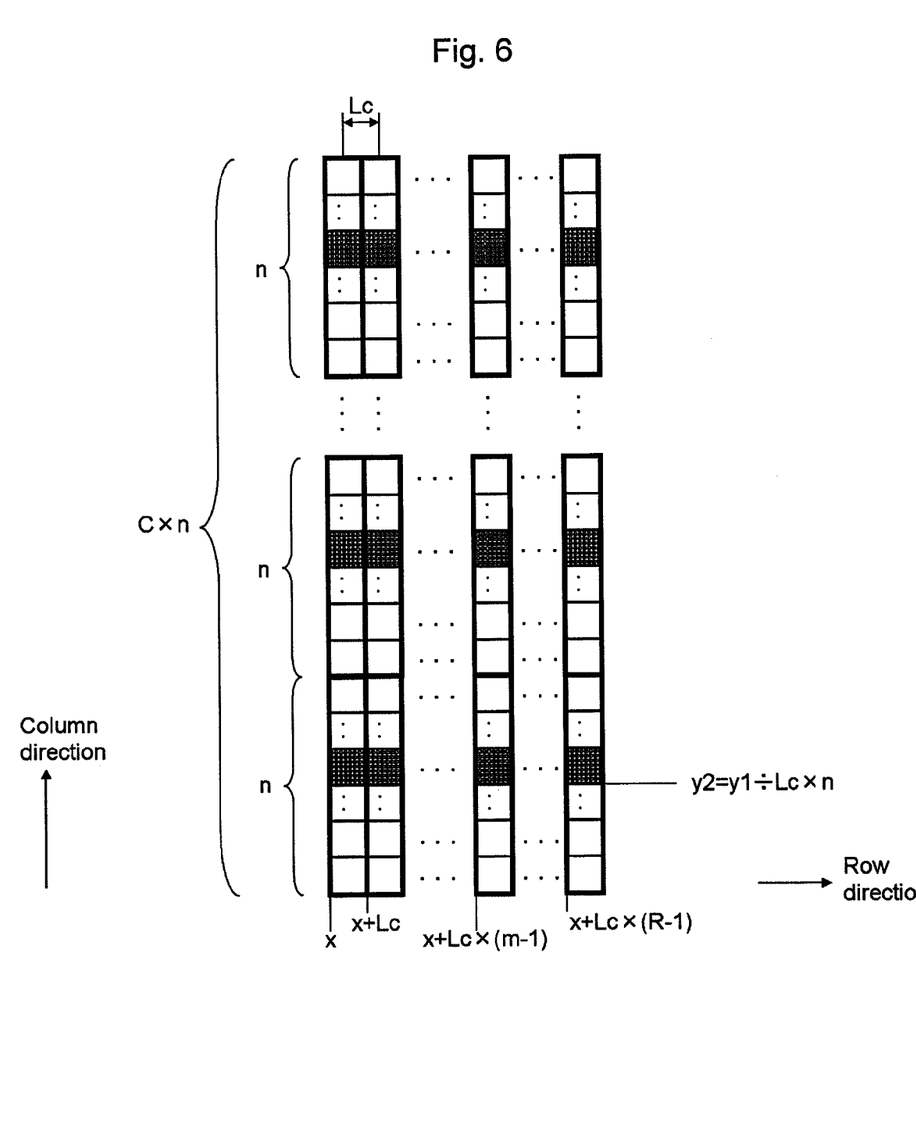
FIG. 6 shows the second data.

As shown in FIG. 6, the second data has an arrangement where the number of data in the row direction is R that is equal to or slightly more than, for example, 768 (=the number of cells constituting display elements of the DMD 33 in the row direction), and where the number of data in the column direction is C×n (=the product of the number of cells in the column direction C multiplied by the resolution n (the number of partitions of the cell)).

The relationship between coordinate y1 of the first data in the column direction before the conversion processing and coordinate y2 of the second data in the column direction after the conversion processing is shown by $y2=y1 \div Lc \times n$.

Figure 4:
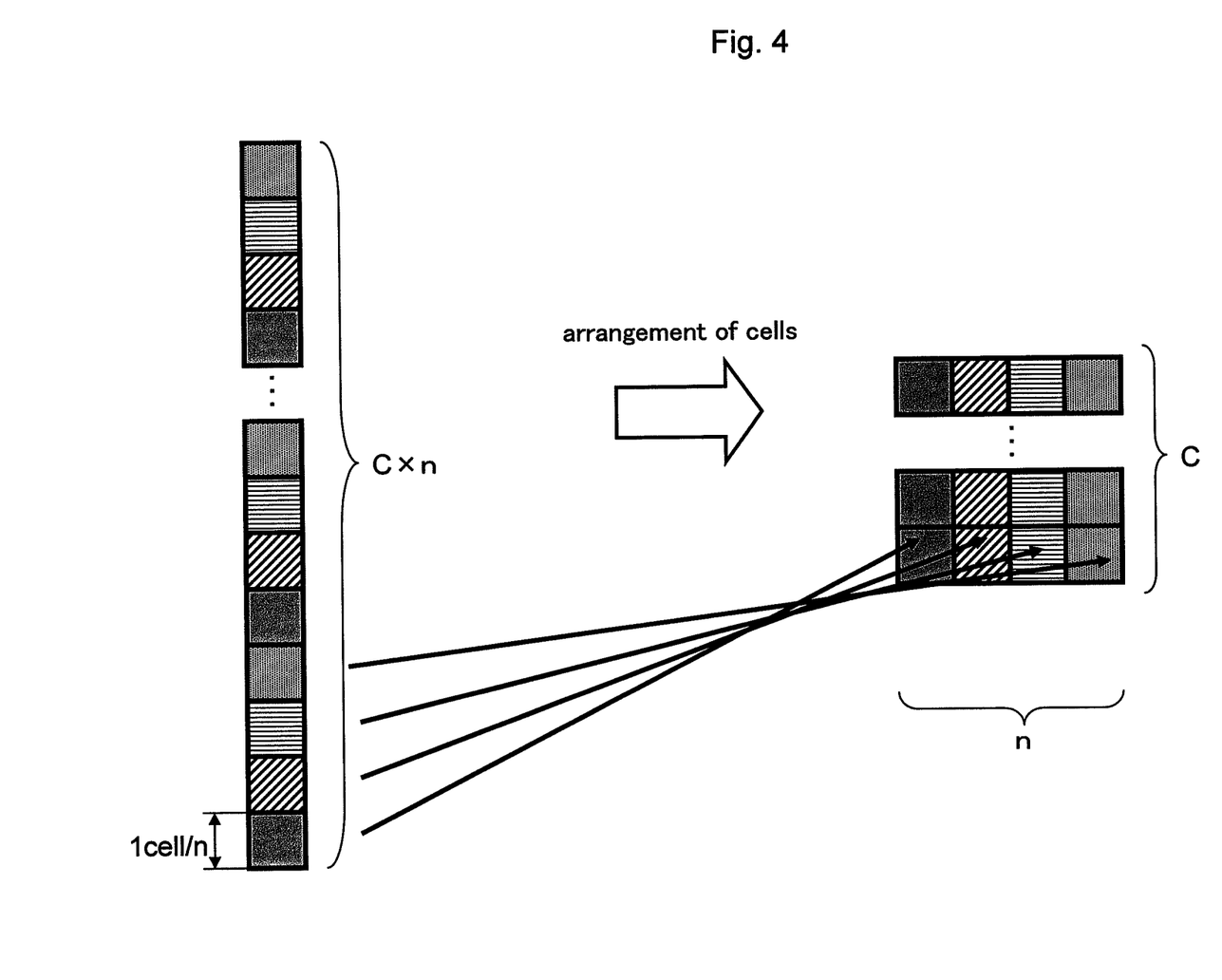
FIG. 4 shows a rearrangement where the arrangement of data of each cell of second data is transposed such that cell data lying in the column direction is rearranged in a row direction.
Figure 7:
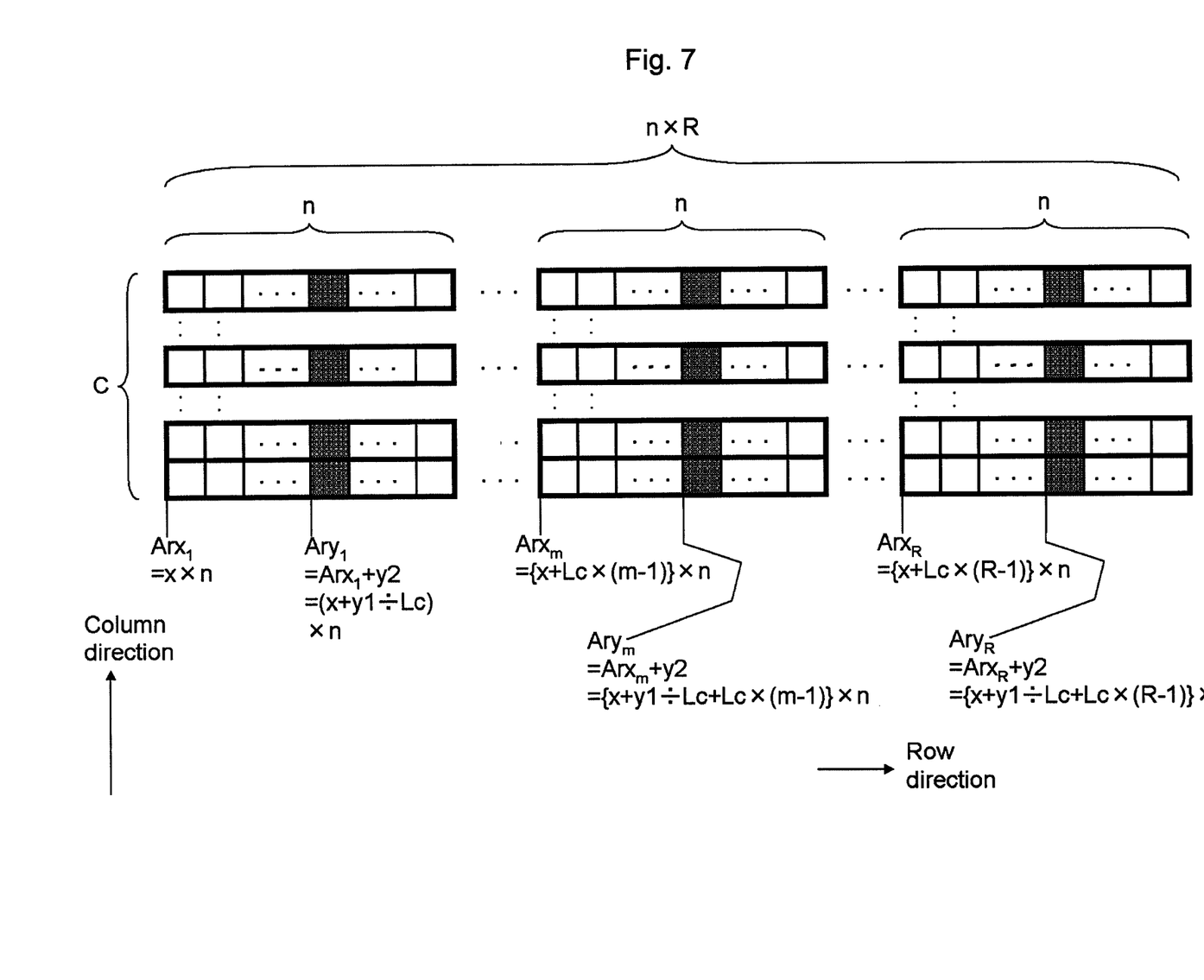
FIG. 7 shows third data.

In the third step, the data of one column whose number of cells is C is read from the bitmap data (the second data) which is stored in the second memory 13 and whose arrangement in the column direction is in the 1/n unit of a cell, and the arrangement of the data of one column is changed from the column direction to the row direction at one cell unit (at every number of the partitions, n) so that the conversion data (the third data) is generated (see FIGS. 4 and 7).

In other words, bits of the cell which are arranged in the column direction are rearranged in the row direction, so that the $k^{th}$ bit of each cell is arranged in the same row. The "k" is an integer that is greater than or equal to 1 and is less than or equal to n that is the number of partitions of the cell. FIG. 4 shows the rearrangement when n is equal to 4.

The third data which is rearranged is stored in the third memory 16.

As shown in FIG. 7, the third data has an arrangement where the number of data in the row direction is n and where the number of data in the column direction is C as the data of one column, and where the number of data in the row direction, n×R (=the product of the number of partitions of the cell n multiplied by the number of the second data in the row direction R), and where the number of data in the column direction is C as the data of all columns.

Row address $Arx_1$ of the bit (the top bit of the block having the n bits in the row direction) corresponding to the coordinate x of the $1^{st}$ row cell of the DMD 33 is shown by $Arx_1 = x \times n$.

Row address $Ary_1$ of the bit corresponding to the coordinate y is shown by $Ary_1 = Arx_1 + y2 = (x + y \div Lc) \times n$.

The row address $Arx_m$ of the bit (the top bit of the block having the n bits in the row direction) corresponding to the coordinate x of the $m^{th}$ row cell of the DMD 33 is shown by $Arx_m = \{x + Lc \times (m-1)\} \times n$, where "m" is an integer that is greater than or equal to 1 and is less than or equal to R (the number of the second data in the row direction R).

Row address $Ary_m$ of the bit corresponding to the coordinate y is shown by $Ary_m = Arx_m + y2 = \{x + y \div Lc + Lc \times (m-1)\} \times n$.

In the fourth step, the controller 10 accesses the cell coordinate table 15, and the row address of the top bit corresponding to the top cell of the column where the burst transfer is performed is read from the cell coordinate table 15.

In the fifth step, the burst transfer of the bitmap data of one column including the row address of the top bit corresponding to the top cell of the column from the third memory 16 to the exposure data memory 17 is performed on the basis of the row address which is read from the cell coordinate table 15, and then, the bitmap data which is transferred is stored in the exposure data memory 17.

In other words, when the burst transfer of the third data is performed at every column unit, the third data is read at every column unit on the basis of the information regarding the cell coordinate of the top cell of the column, where the burst transfer is performed, that is obtained by accessing the cell coordinate table 15.

For example, in the case where the burst transfer of the bitmap data (the third data) of the $m^{th}$ column is performed, the row address $Ary_m$ of the top bit corresponding to the top cell is read from the cell coordinate table 15, and then, the burst transfer of the bitmap data of the column including the top cell of the top bit corresponding to the row address $Ary_m$ in the third data (the $m^{th}$ column data) to the exposure data memory 17 is performed.

After the operations in the third, fourth, and fifth steps are repeatedly performed for all of the rows (e.g., 768 rows in the disclosed embodiment), the exposure data, data that has the bitmap data corresponding to each cell constituting the DMD 33, corresponding to one picture that is displayed (radiated) by the DMD 33 is generated and is stored in the exposure data memory 17.

Therefore, the number of accesses to the cell coordinate table 15 in the fourth step is equal to the number of the row R (=the number of cells constituting each display elements of the DMD 33 in the row direction, i.e., 768). In other words, a bit is read at every column unit. Accordingly, the number of accesses to the cell coordinate table 15 for generating the exposure data can be reduced compared to the case in which a bit is read at every cell unit. In such case, the number of accesses to the cell coordinate table 15 for generating the exposure data is equal to the product of the number of rows R multiplied by the number of columns C (=768×1024 in the disclosed embodiment).

Figure 1:
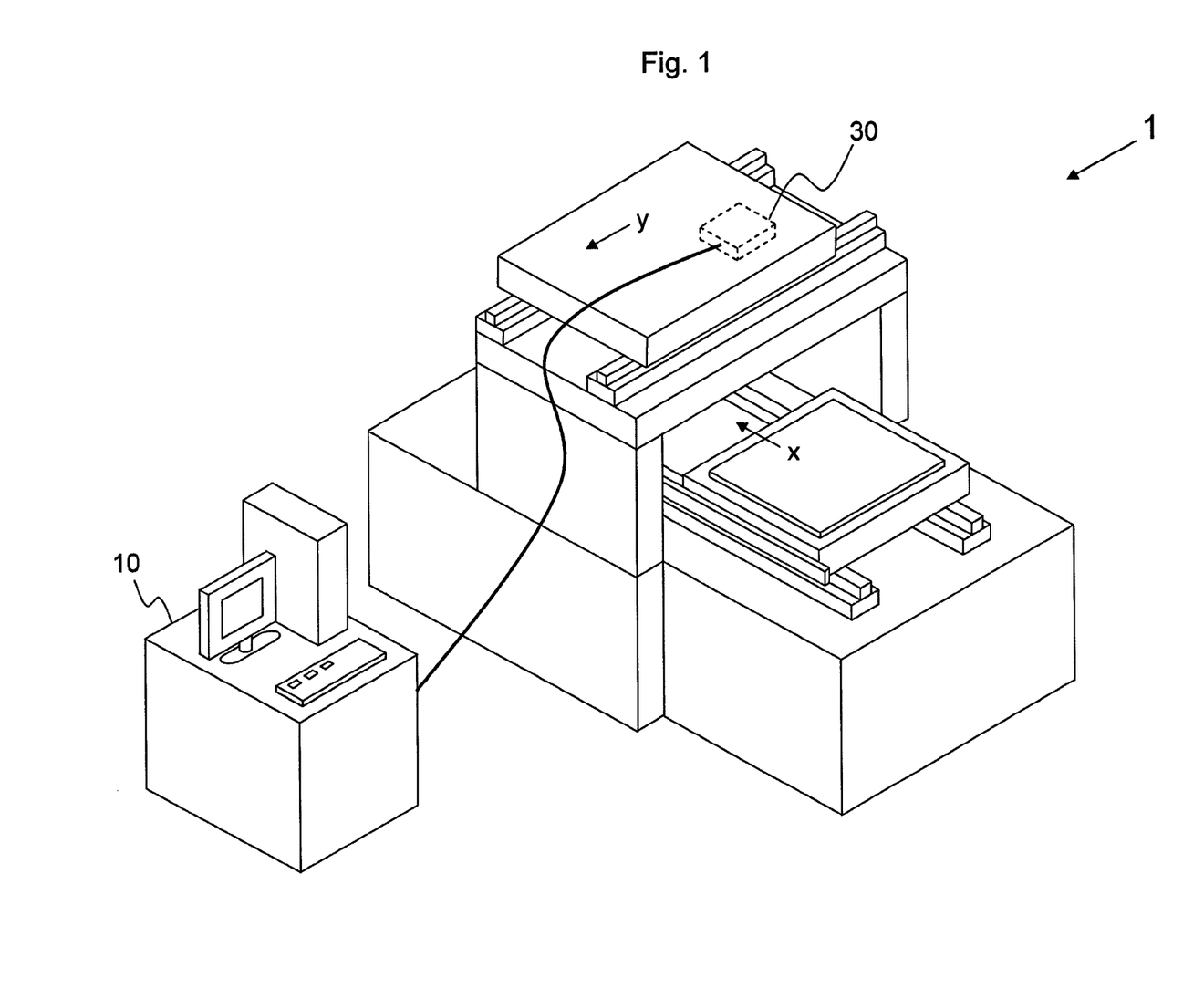
FIG. 1 is a perspective view of a multiple exposure apparatus of the embodiment.

The reduction of the number of accesses contributes to the speed-up of the generation of exposure data. In other words, the exposure-data generating apparatus 1 can generate the exposure data at high speed.

Although the embodiment of the present invention has been described herein with reference to the accompanying drawings, obviously many modifications and changes may be made by those skilled in this art without departing from the scope of the invention.

The present disclosure relates to subject matter contained in Japanese Patent Application No. 2006-345480 (filed on Dec. 22, 2006), which is expressly incorporated herein by reference, in its entirety.

The invention claimed is:

1. An exposure-data generating apparatus, comprising:
a first memory that stores drawing data in bitmap format as first data that is used for an exposure;
a second memory that stores second data whose data unit in a column direction is converted to a resolution unit of information of each cell based on said first data; and
an exposure data memory that stores exposure data that is raster data obtained by a burst transfer of third data at every column unit,
said second data being rearranged and converted to said third data, where an arrangement of data of each cell of said second data in said column direction is changed to a row direction, and
said cell constituting a display element of a Digital Micromirror Device that performs said exposure based on said exposure data.

2. The exposure generating apparatus according to claim 1, further comprising a cell coordinate table that stores a conversion table of a cell coordinate corresponding to a cell number of said cell;
wherein when said burst transfer of said third data is performed at every column unit, said third data is read at every column unit on the basis of information regarding said cell coordinate of a top cell of said column, where said burst transfer is performed, that is obtained by accessing to said cell coordinate table.

3. The exposure generating apparatus according to claim 2, wherein said cell coordinate table comprises a Static Random Access Memory.

4. The exposure generating apparatus according to claim 1, further comprising a Dynamic Random Access Memory that stores said third data.

* * * * *